United States Patent
Xia et al.

(10) Patent No.: US 10,861,356 B2
(45) Date of Patent: Dec. 8, 2020

(54) TRANSFER PRINTING SUBSTRATE AND METHOD FOR PRODUCING THE SAME

(71) Applicant: Shanghai Tianma Micro-Electronics Co., Ltd., Shanghai (CN)

(72) Inventors: Xingda Xia, Shanghai (CN); Junhui Lou, Shanghai (CN); Zeshang He, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 270 days.

(21) Appl. No.: 15/960,901

(22) Filed: Apr. 24, 2018

(65) Prior Publication Data
US 2019/0147778 A1 May 16, 2019

(30) Foreign Application Priority Data
Nov. 10, 2017 (CN) .......................... 2017 1 1105426

(51) Int. Cl.
*H01L 29/06* (2006.01)
*G09F 9/33* (2006.01)
(Continued)

(52) U.S. Cl.
CPC ................. *G09F 9/33* (2013.01); *B41C 1/06* (2013.01); *H01L 21/6835* (2013.01);
(Continued)

(58) Field of Classification Search
CPC .................................. G09F 9/33; H01L 29/06
(Continued)

(56) References Cited

U.S. PATENT DOCUMENTS

| 8,791,530 B2 * | 7/2014 | Bibl ...................... B81C 99/002 |
| | | 257/414 |
| 9,035,279 B2 * | 5/2015 | Hu .......................... H01L 24/83 |
| | | 257/13 |

(Continued)

FOREIGN PATENT DOCUMENTS

| CN | 105359283 A | 2/2016 |
| TW | 201614860 A | 4/2016 |

*Primary Examiner* — Jami Valentine Miller
(74) *Attorney, Agent, or Firm* — Tarolli, Sundheim, Covell & Tummino LLP

(57) ABSTRACT

Provided is a transfer printing substrate and a method for producing the same, in order to improve yield of picking up of the micro-components and further improve quality of image display. The transfer printing substrate includes a carrying substrate, a plurality of supporting structures, and a plurality of micro-components corresponding to the plurality of support structures in one-to-one correspondence, wherein each of the plurality of supporting structures includes a fixing part and a suspended supporting part, wherein an end of the fixing part is fixed on the carrying substrate, an end of the suspended supporting part is connected to the fixing part, the other end of the suspended supporting part supports a corresponding one of the plurality of micro-components, and a first moving space is provided between the suspended supporting part and the carrying substrate. The transfer printing substrate is used for transferring the micro-components.

9 Claims, 9 Drawing Sheets

(51) Int. Cl.
  *B41C 1/06* (2006.01)
  *H01L 23/00* (2006.01)
  *H01L 21/683* (2006.01)
  *H01L 33/00* (2010.01)
  *B41F 16/00* (2006.01)

(52) U.S. Cl.
  CPC .............. *H01L 24/97* (2013.01); *H01L 33/00* (2013.01); *B41F 16/00* (2013.01); *G09G 2300/0426* (2013.01); *H01L 24/29* (2013.01); *H01L 24/32* (2013.01); *H01L 24/83* (2013.01); *H01L 2221/68354* (2013.01); *H01L 2224/2919* (2013.01); *H01L 2224/83005* (2013.01); *H01L 2224/97* (2013.01); *H01L 2924/12041* (2013.01)

(58) Field of Classification Search
  USPC ............................................ 438/455; 257/13
  See application file for complete search history.

(56) References Cited

U.S. PATENT DOCUMENTS

| | | | |
|---|---|---|---|
| 9,105,492 B2 * | 8/2015 | Bibl | ..................... B25J 15/0085 |
| 2014/0064904 A1 * | 3/2014 | Bibl | ..................... B81C 99/002 |
| | | | 414/751.1 |
| 2014/0340900 A1 * | 11/2014 | Bathurst | ............... B81C 99/002 |
| | | | 362/249.02 |

* cited by examiner

TRANSFER PRINTING SUBSTRATE AND METHOD FOR PRODUCING THE SAME

CROSS-REFERENCE TO RELATED APPLICATIONS

The present application claims the benefit of priority to Chinese Patent Application No. 201711105426.3, filed on Nov. 10, 2017, the content of which is incorporated herein by reference in its entirety.

TECHNICAL FIELD

The present disclosure relates to the field of display technology, and more particularly to a transfer printing substrate and a method for producing the transfer printing substrate.

BACKGROUND

Micro transfer printing technology refers to a technology in which micro-components are selectively picked up and transferred to a substitute substrate by using high-precision motion control transfer printing heads.

Taking a micro light emitting diodes (LED) display panel as an example, when producing a micro LED display panel, LED particles are not directly formed on a display substrate but formed on a transfer printing substrate, and then the LED particles formed on the transfer printing substrate are picked up by transfer printing heads and are transferred onto the display substrate. However, the LED particles formed on the transfer printing substrate would have different thicknesses due to processing fluctuations, and thus the LED particles with a small thickness may not be successfully picked up, affecting yield of picking up and resulting in a poor image display.

SUMMARY

In the light of this, the embodiments of the present disclosure provide a transfer printing substrate and a method for producing the transfer printing substrate so as to improve yield of picking up of the micro-components and further improve quality of image display.

On one hand, embodiments of the present disclosure provide a transfer printing substrate including a carrying substrate, a plurality of supporting structures, and a plurality of micro-components corresponding to the plurality of support structures in one-to-one correspondence. Each of the plurality of supporting structures includes a fixing part and a suspended supporting part. An end of the fixing part is fixed on the carrying substrate. An end of the suspended supporting part is connected to the fixing part, and another end of the suspended supporting part supports the corresponding one of the plurality of micro-components. A first moving space is provided between the suspended supporting part and the carrying substrate.

On the other hand, embodiments of the present disclosure further provide a method for producing a transfer printing substrate, the transfer printing substrate including a carrying substrate, a plurality of supporting structures, and a plurality of micro-components corresponding to the plurality of support structures in one-to-one correspondence. Each of the plurality of supporting structures includes a fixing part and a suspended supporting part. An end of the fixing part is fixed on the carrying substrate. An end of the suspended supporting part is connected to the fixing part, and another end of the suspended supporting part supports the corresponding one of the plurality of micro-components. A first moving space is provided between the suspended supporting part and the carrying substrate. The method includes steps of: providing a growth substrate; forming a plurality of micro-component mesa structures on the growth substrate; forming a plurality of support structures corresponding to the plurality of micro-component mesa structures in one-to-one correspondence, so that each of the plurality of supporting structures includes a fixing part and a suspended supporting part, wherein an end of the suspended supporting part contacts with a corresponding one of the plurality of micro-component mesa structures, and another end of the suspended supporting part is connected to the fixing part; arranging a carrying substrate at a side of the support structure facing away from the growth substrate, wherein the fixing part supports the carrying substrate, and the first moving space is provided between the suspended supporting part and the carrying substrate; and removing the growth substrate after arranging the carrying substrate, and processing the plurality of micro-component mesa structures so as to form a plurality of micro-components.

Any one of the said technical solutions has the following advantageous effects:

When picking up the micro-components formed on the transfer printing substrate by transfer printing heads, since different micro-components have different thicknesses, the micro-component with a greater thickness contacts with the corresponding micro-component first during a process of a transfer printing head fixing component driving the transfer printing heads to move towards the carrying substrate. Since a first moving space is provided between the suspended supporting part and the carrying substrate of the supporting structure, when part of the transfer printing heads contact with the micro-components with greater thicknesses, the transfer printing head fixing component continues driving the transfer printing heads to move towards the carrying substrate. At this moment, the suspended supporting parts for the micro-components with greater thicknesses are deformed towards the carrying substrate until all of the micro-components contact with the corresponding transfer printing heads. Then the transfer printing heads pick up all of the micro-components and transfer them to the display substrate based on the principle of electrostatic clamping that charges of different polarities attract each other. Therefore, using said technical solutions can ensure sufficient contact of the micro-components with different thicknesses formed on the transfer printing substrate and the corresponding transfer printing heads, so that all of the micro-components are picked up by the corresponding transfer printing heads, the yield of picking up is improved, and the problem of uneven image brightness caused by missing of part of the micro-components on the display substrate is avoided.

BRIEF DESCRIPTION OF DRAWINGS

In order to explain the technical solutions of the embodiments of the present disclosure more clearly, the drawings to be used by the embodiments are briefly described hereinafter. The drawings described hereinafter are only some of the embodiments of the present disclosure. A person skilled in the art may obtain other drawings according to these drawings without involving any inventive skills.

DESCRIPTION OF EMBODIMENTS

For a better understanding of the technical solutions of the present disclosure, the embodiments of the present disclosure are hereinafter described in details with reference to the drawings.

It should be clear that the described embodiments are only part of the embodiments, rather than all of the embodiments of the present disclosure. Based on the embodiments in the present disclosure, any other embodiments obtained by a person skilled in the art without involving any inventive skills falls within the protection scope of the present disclosure.

The terms used in the embodiments of the present disclosure are only used for the purpose of describing particular embodiments and do not intend to limit the present disclosure. The words "a/an", "said" and "the" in the singular form used in the embodiments and the appended Claims of the present disclosure also intend to include the plural form, unless otherwise clearly indicated in the context.

It should be understood that the term "and/or" used in the text only indicates a related relation describing related objects and indicates that there may be three relations, for example A and/or B may indicates three conditions of: A only, both A and B, and B only. Furthermore, the character "/" in the text generally indicates an "or" relation of the previous and following related objects.

It should be understood that the embodiments of the present disclosure may use the terms "first", "second", etc. to describe the conducting layers, these conducting layers, however, should not be limited by these terms. These terms are only used for distinguishing the conducting layers from each other. For example, without departing from the scope of the embodiments of the present disclosure, the first conducting layer may also be called as the second conducting layer. Similarly, the second conducting layer may also be called as the first conducting layer.

Figure 1:
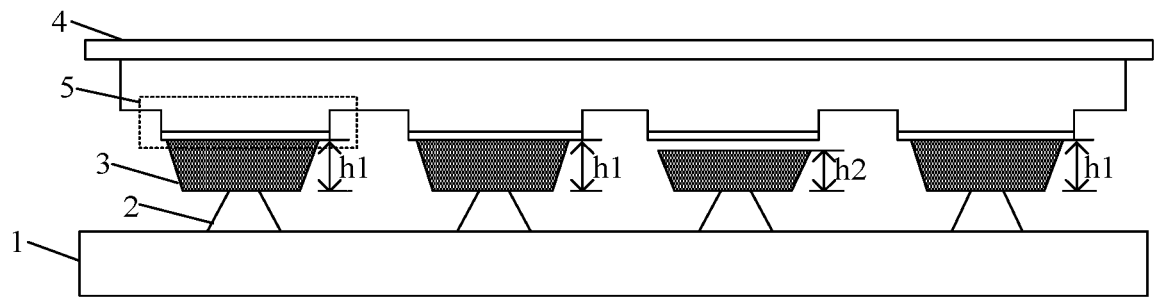
FIG. 1 is a schematic diagram of a transfer printing heads picking up the micro-components in the related art.

The transfer printing substrate in the related art includes a carrying substrate 1, a plurality of supporting columns 2 formed on the carrying substrate 1, and micro-components 3 correspond to the plurality of supporting columns 2 in one-to-one correspondence, as shown in FIG. 1. However, different micro-components 3 would have different thicknesses due to processing fluctuations. For example, during the process of forming the micro-components 3, part of the formed micro-components 3 would have a thickness h2 smaller than the thickness h1 of other micro-components 3 due to influences of photolithographic technology and the like. In that case, when a transfer printing head fixing component 4 drives a plurality of transfer printing heads 5 to move towards a carrying substrate 1 so that the transfer printing heads 5 pick up the micro-components 3, the micro-components 3 having a thickness of h2 still have a distance of h1-h2 from the corresponding transfer printing heads 5 when the transfer printing heads 5 contact with the micro-components 3 having a thickness of h1, so that the micro-components 3 having a thickness of h2 cannot contact with the corresponding transfer printing heads 5 and then cannot be picked up by the transfer printing heads 5.

Thus, when the transfer printing heads 5 transfer the picked-up micro-components 3 to the display substrate, the display substrate will lack part of the micro-components 3, so that the areas lacking the micro-components 3 display a black spot, instead of displaying a normal brightness, during displaying images, which causes an uneven brightness of the displayed images.

It should be pointed out that it is only illustrative that the micro-components 3 formed on the transfer printing substrate shown in FIG. 1 include the micro-components 3 having a thickness of h1 and the micro-components 3 having a thickness of h2. Actually, the thicknesses of the formed micro-components 3 may have various differences. When micro-components 3 of various thicknesses are formed on the transfer printing substrate, the same problem will occur, which is not repeated herein.

Figure 2:
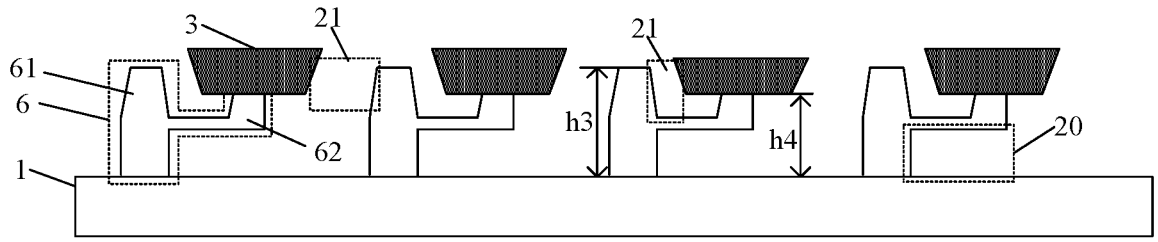
FIG. 2 is a structural schematic diagram of a transfer printing substrate provided in an embodiment of the present disclosure.

In order to solve said problem, the embodiments of the present disclosure provide a transfer printing substrate as shown in FIG. 2. The transfer printing substrate includes a carrying substrate 1, a plurality of supporting structures 6 and a plurality of micro-components 3, wherein the plurality of micro-components 3 correspond to the plurality of supporting structures 6 one by one.

The supporting structure 6 includes a fixing part 61 and a suspended supporting part 62, wherein an end of the fixing part 61 is fixed on the carrying substrate 1, an end of the suspended supporting part 62 is connected to the fixing part 61, the other end of the suspended supporting part 62 supports the corresponding micro-component 3, and a first moving space 20 is provided between the suspended supporting part 62 and the carrying substrate 1.

When picking up the micro-components 3 formed on the transfer printing substrate by using the transfer printing heads 5, since different micro-components 3 have different thicknesses, the micro-components 3 with greater thicknesses will contact with the corresponding micro-components 3 first during the transfer printing head fixing component 4 driving the transfer printing heads 5 to move towards the carrying substrate 1. Since a first moving space 20 is provided between the suspended supporting part 62 and the carrying substrate 1 of the supporting structure 6, when part of the transfer printing heads 5 contact with the micro-components 3 with greater thicknesses, the transfer printing head fixing component 4 continues driving the transfer printing heads 5 to move towards the carrying substrate 1. At this moment, the suspended supporting parts 62 for the micro-components 3 with greater thicknesses are deformed towards the carrying substrate 1 until all of the micro-components 3 contact the corresponding transfer printing heads 5. Then the transfer printing heads 5 pick up all of the micro-components 3 and transfer them to the display substrate based on the principle of electrostatic clamping that charges of different polarities attract each other.

Figure 3:
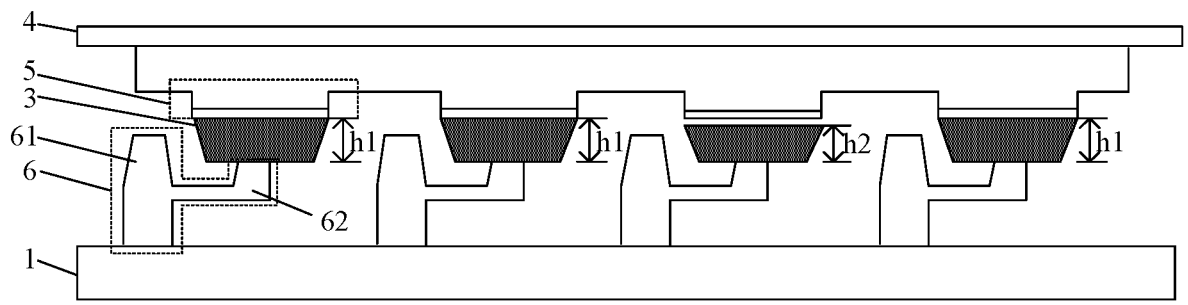
FIG. 3 is a procedural schematic diagram of the transfer printing heads picking up the micro-components formed on the transfer printing substrate provided in the embodiment of the present disclosure.
Figure 4:
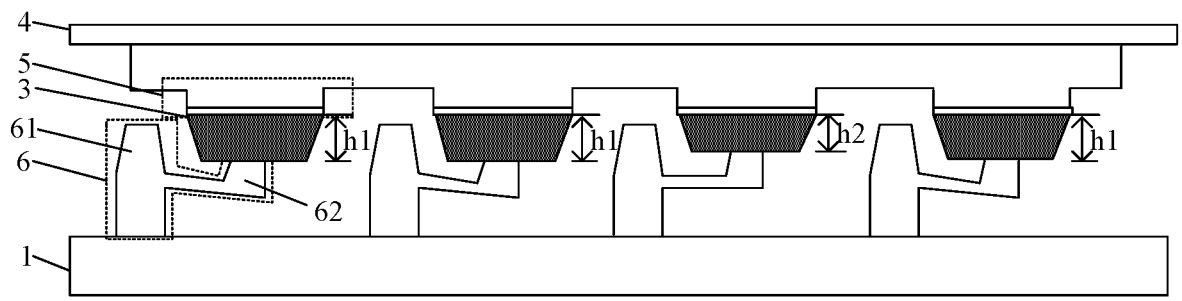
FIG. 4 is another procedural schematic diagram of the transfer printing heads picking up the micro-components formed on the transfer printing substrate provided in the embodiment of the present disclosure.

Referring to FIGS. 3 and 4, taking micro-components 3 having a thickness of h1 and micro-components 3 having a thickness of h2 formed on the transfer printing substrate as an example, when picking up the micro-components 3 formed on the transfer printing substrate by using the transfer printing heads 5, the transfer printing head fixing component 4 drives the transfer printing heads 5 to move towards the carrying substrate 1. Since h1>h2, part of the transfer printing heads 5 contact with the micro-components 3 having a thickness of h1 first, as shown in FIG. 3. At this moment, the micro-components 3 having a thickness of h2 have a distance of h1-h2 from the corresponding transfer printing heads 5. The transfer printing head fixing component 4 then continues driving the transfer printing heads 5 to move towards the carrying substrate 1, as shown in FIG. 4. At this moment, the suspended supporting parts 62 for supporting the micro-components 3 having a thickness of h1 are deformed towards the carrying substrate 1 until the remaining part of transfer printing heads 5 contacts with the micro-components 3 having a thickness of h2.

Therefore, using the transfer printing substrate provided in this embodiment can ensure sufficient contact of the micro-components 3 with different thicknesses formed on the transfer printing substrate with the corresponding transfer printing heads 5, so that all of the micro-components 3 are picked up by the corresponding transfer printing heads 5, the yield of picking up is improved, and the problem of uneven image brightness caused by missing of part of the micro-components 3 on the display substrate is avoided.

Furthermore, when the transfer printing heads 5 continue moving towards the carrying substrate after the transfer printing heads 5 contact with the corresponding micro-components 3, the suspended supporting parts 62 supporting this part of micro-components 3 will be deformed towards the carrying substrate 1. Based on the mechanics principles, when the suspended supporting parts 62 are deformed towards the carrying substrate 1, the suspended supporting parts 62 will produce a rebounding force facing away from the carrying substrate 1 at the same time. The rebounding force leads to a tighter contact between the suspended supporting parts 62 and the corresponding micro-components 3, so that the yield of picking up is further improved.

Referring to FIG. 2 again, the fixing part 61 of each of the supporting structures 6 is located between two adjacent micro-components 3, and the vertical distance h3 between the carrying substrate 1 and a surface of the fixing part 61 facing away from the carrying substrate 1 (the upper surface of the fixing part 61 shown in FIG. 2) is greater than the vertical distance h4 between the carrying substrate 1 and a surface of the micro-component 3 facing towards the carrying substrate 1 (the lower surface of the micro-component 3 shown in FIG. 2).

Since the micro-components 3 are only supported by the suspended supporting parts 62, the micro-components 3 may be deviated from their corresponding suspended supporting parts 62, and then the corresponding locations between the micro-components 3 and the transfer printing heads 5 are deviated, resulting in a poor contact between the micro-components 3 and the transfer printing heads 5, so that the micro-components 3 cannot be picked up successfully. However, the fixing parts 61 can limit the location of the micro-components 3 by arranging the fixing part 61 of each of the supporting structures 6 between two adjacent micro-components 3 and making the vertical distance between the carrying substrate 1 and the surface of the fixing part 61 facing away from the carrying substrate 1 greater than the vertical distance between the carrying substrate 1 and the surface of the micro-component 3 facing towards the carrying substrate 1, so as to reduce deviation of the micro-components 3, so that the micro-components 3 can be better picked up by the corresponding transfer printing heads 5.

Furthermore, referring to FIG. 2 again, a second moving space may be provided between the fixing parts 61 and the adjacent micro-components 3. In this way, abrasion to the micro-components 3 by the fixing parts 61 caused by an excessive close distance between the fixing parts 61 and the adjacent micro-components 3 can be avoided, and a disadvantageous influence to the display performance can also be avoided.

Optionally, the fixing part 61 and the suspended supporting part 62 of each of the supporting structures 6 can be formed in one piece. That is to say, the fixing part 61 and the suspended supporting part 62 are formed by applying the same design technology to the same film layer in the production process. According to such an arrangement, on one hand, the production process can be simplified and processes can be reduced. On the other hand, when the suspended supporting part 62 is deformed, the probability of the suspended supporting part 62 being broken from the fixing part 61 can be reduced by forming the suspended supporting part 62 and the fixing part 61 in one piece, compared with the manner in which the fixing part 61 and the suspended supporting part 62 are two independent structures and the suspended supporting part 62 is adhered on the fixing part 61.

When part of the transfer printing heads 5 contact with the micro-components 3 with greater thicknesses, in order to pick up the micro-components 3 having smaller thicknesses, the transfer printing head fixing component 4 has to continue driving the transfer printing heads 5 to move towards the carrying substrate 1, which deforms the suspended supporting parts 62 supporting the micro-components 3 having greater thicknesses towards the carrying substrate 1. When the micro-components 3 have great thickness differences, the suspended supporting parts 62 are deformed greatly, which may lead to breaking of the suspended supporting parts 62. In this way, when the transfer printing heads 5 drive the transfer printing heads 3 away from the carrying substrate 1, the suspended supporting parts 62 broken from the fixing parts 61, together with the corresponding micro-components 3, will be driven away from the carrying substrate 1 and then be transferred to the display substrate together with the corresponding micro-components 3, which leads to a poor contact between wiring of the display substrate and this part of the micro-components 3 and further impacts normal display.

Figure 5:
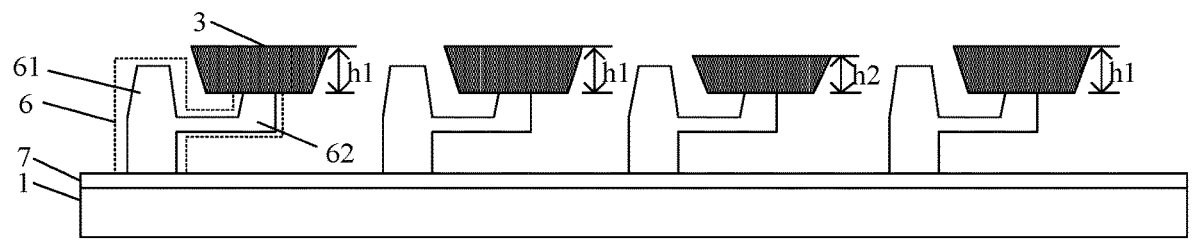
FIG. 5 is a structural schematic diagram of a transfer printing substrate provided in another embodiment of the present disclosure.

In order to solve said problem, the transfer printing substrate provided in this embodiment may also include a first adhesive layer 7 arranged on the carrying substrate 1, wherein the orthographic projection of the first adhesive layer 7 covers the surface of the carrying substrate 1, as shown in FIG. 5. The fixing part 61 of each of the supporting structures 6 is fixedly connected to the carrying substrate 1 in a manner of being adhered on the first adhesive layer 7.

By means of arranging a first adhesive layer 7 on the carrying substrate 1, on one hand, the fixing part 61 can be adhered, achieving a more stable connection between the fixing parts 61 and the carrying substrate 1 and a better stability of the supporting structures 6. On the other hand, when the suspended supporting part 62 is broken, the broken suspended supporting part 62 will be adhered on the first adhesive layer 7, in which way the broken suspended supporting part 62 cannot be driven away from the carrying substrate 1 together with the corresponding micro-components 3 by the transfer printing heads 5, so that the influence on normal display is prevented.

Figure 6:
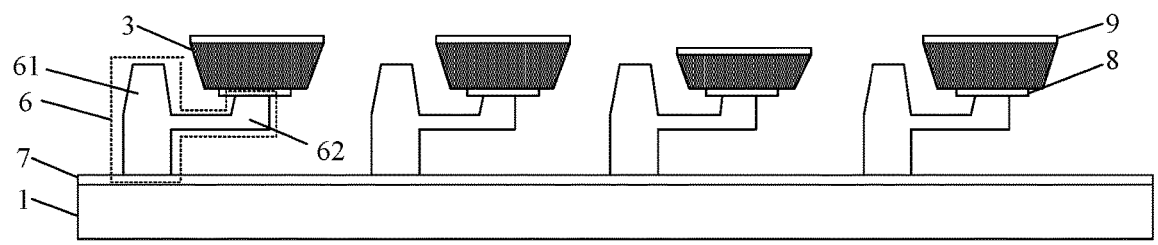
FIG. 6 is a structural schematic diagram of a transfer printing substrate provided in another embodiment of the present disclosure.

When the micro-components 3 are micro-LEDs, the transfer printing substrate also includes a first conducting layer 8 arranged between the micro-components 3 and the corresponding suspended supporting parts 62, and a second conducting layer 9 arranged on the surface of the micro-components 3 facing away from the carrying substrate 1, as shown in FIG. 6.

Figure 7:
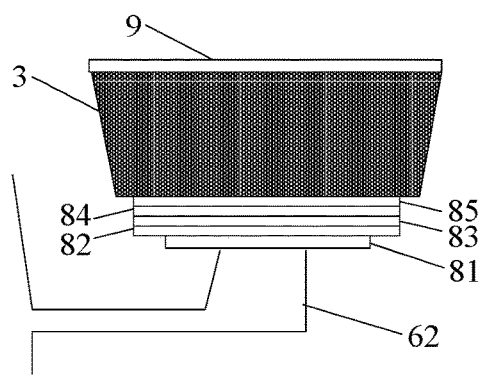
FIG. 7 is a structural schematic diagram of the first conducting layer of the transfer printing substrate provided in the embodiments of the present disclosure.

The first conducting layer 8 may include a bonding layer 81, a diffusion blocking layer 82, a sticking-blocking layer 83, a reflector layer 84 and an electrode layer 85 arranged on the suspended supporting part 62 in sequence, as shown in FIG. 7. The bonding layer 81 herein is used for increasing adhesive force between the micro-component 3 and the display substrate after the micro-components 3 are transferred to the display substrate. The bonding layer 81 may be made of a conducting material such as pure metal, an alloy, etc. The diffusion blocking layer 82 of the bonding layer 81 may be made of a metallic material such as platinum. The sticking-blocking layer 83 may be made of a metallic material such as titanium. The reflector layer 84 is used for reflecting visible light of different wavelengths and may be made of a metallic material such as silver. The electrode layer 85 forms an ohmic contact with the doped semiconductor layer of the micro-component 3 and may be made of a metallic material having a high work function, such as nickel.

It should be pointed out that the transfer printing head fixing component 4 drives the transfer printing heads 5 to continue moving towards the carrying substrate 1 after part of the transfer printing heads 5 contact with the corresponding micro-components 3, so that the force applied on the bonding layer 81 of the first conducting layer 8 by the transfer printing heads 5 can be dispersed when the suspended supporting parts 62 are deformed towards the carrying substrate 1, which can effectively reduce the damage to the bonding layer 81 when the transfer printing heads 5 pick up the micro-components 3.

In order to arrange the micro-components 3 more regularly, the plurality of micro-components 3 formed on the carrying substrate may be arranged in matrix.

Embodiments of the present disclosure further provide a method for producing the transfer printing substrate, which method is applicable to the transfer printing substrate described as above.

Figure 8:
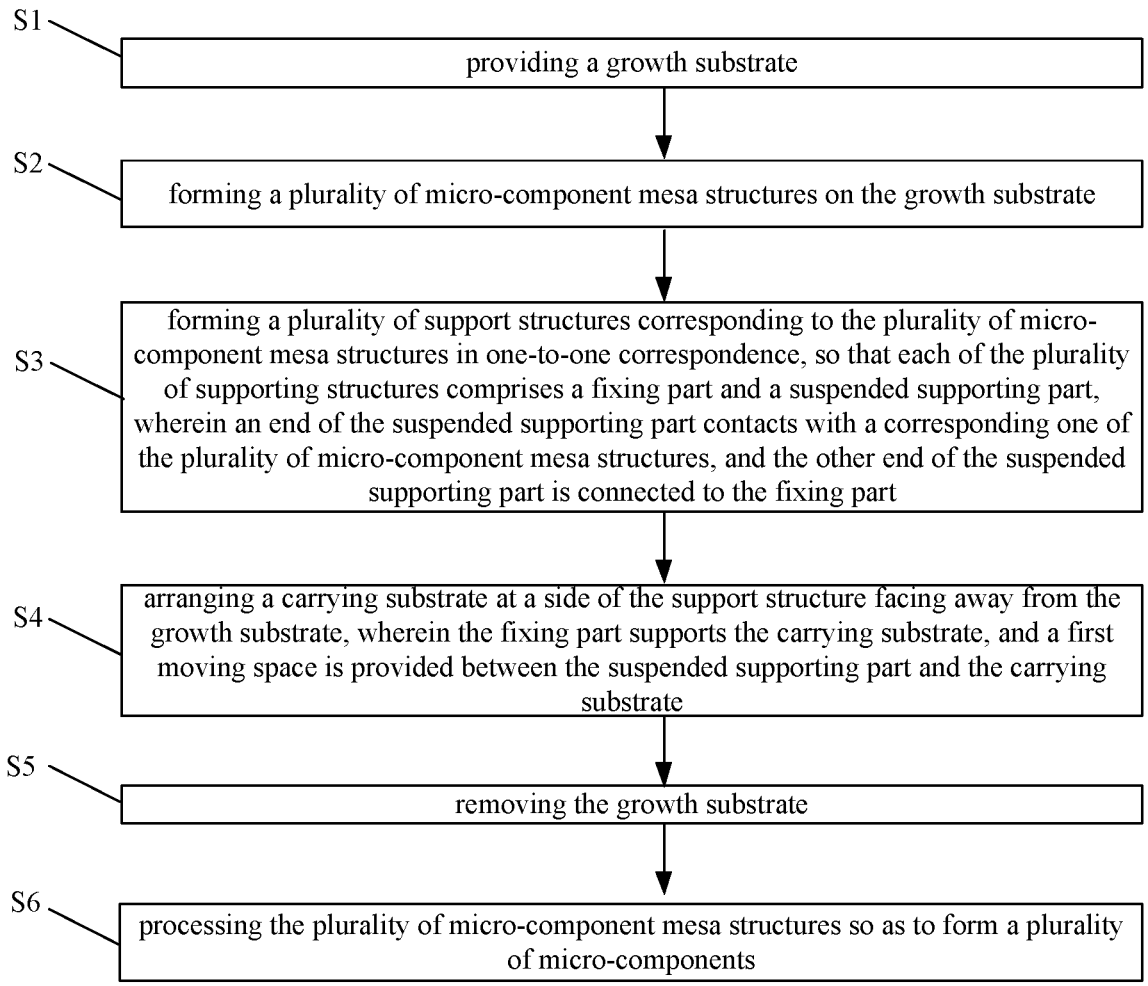
FIG. 8 is a schematic diagram of a method for producing the transfer printing substrate provided in a first embodiment of the present disclosure.

As shown in FIG. 8, the method for producing the transfer printing substrate provided by this embodiment includes:

Step S1: providing a growth substrate.

Step S2: forming a plurality of micro-component mesa structures on the growth substrate.

Step S3: forming a plurality of supporting structures corresponding to the plurality of micro-component mesa structures in one-to-one correspondence, such that each of the supporting structures includes a fixing part and a suspended supporting part, wherein an end of the suspended supporting part contacts with the corresponding micro-component mesa structure, and the other end of the suspended supporting part is connected to the fixing part.

Step S4: arranging a carrying substrate at a side of the supporting structure facing away from the growth substrate, wherein the carrying substrate is supported by the fixing part, and a first moving space is provided between the suspended supporting part and the carrying substrate.

Step S5: removing the growth substrate.

Step S6: processing the plurality of micro-component mesa structures so as to form a plurality of micro-components.

With respect to the transfer printing substrate produced by said method, since a first moving space is provided between the suspended supporting part and the carrying substrate of the supporting structure, when part of the transfer printing heads contact with the micro-components with greater thicknesses, the transfer printing heads can continue moving towards the carrying substrate. At this moment, the suspended supporting parts for supporting this part of the micro-components are deformed towards the carrying substrate until all of the transfer printing heads contact with the micro-components. Therefore, the method for producing a transfer printing substrate provided by this embodiment can ensure sufficient contact of the micro-components having different thicknesses formed on the transfer printing substrate with the corresponding transfer printing heads, so that all of the micro-components are picked up by the corresponding transfer printing heads, thus the yield of picking up is improved, and the problem of uneven image brightness caused by missing of part of the micro-components on the display substrate is avoided.

The material of the growth substrate can be selected according to the type of the micro-components. For example, when the micro-components are micro-LEDs, the growth substrate is generally made of sapphire glass.

Furthermore, after the step S1 provides the growth substrate, an epitaxial growth layer can be further formed on the growth substrate by means of epitaxial growth technology so as to eliminate dislocation in the layers, wherein the epitaxial growth layer may be made of gallium nitride base material.

Figure 9:
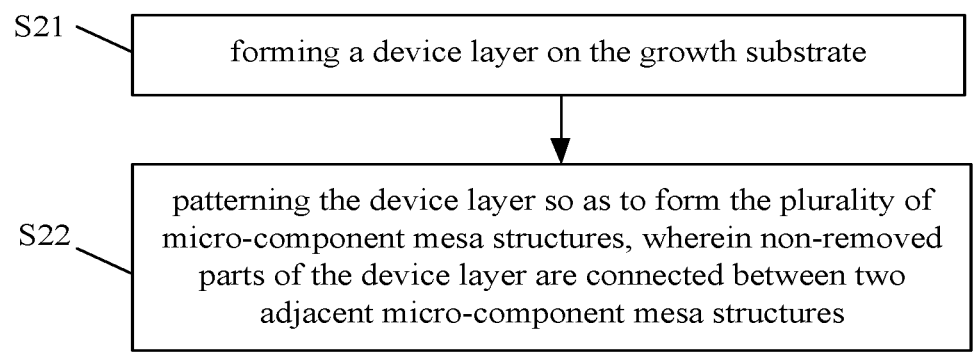
FIG. 9 is a schematic diagram of a method for producing the transfer printing substrate provided in a second embodiment of the present disclosure.
Figure 10:
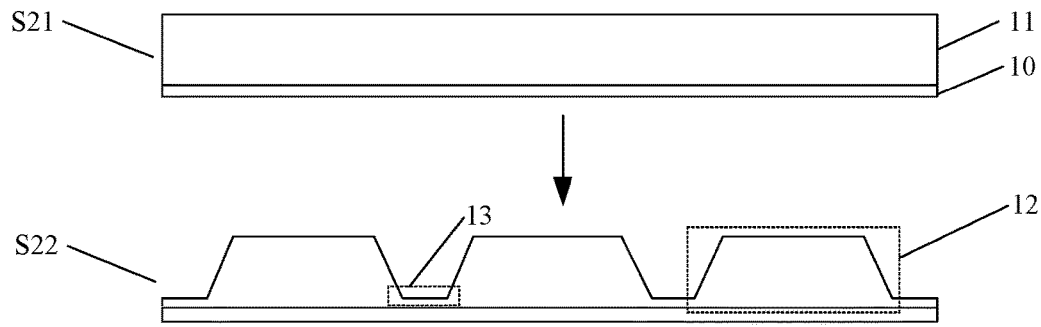
FIG. 10 is a process flow diagram of the method for producing the transfer printing substrate provided in the second embodiment of the present disclosure.

As shown in FIGS. 9 and 10, the step S2 may include:

Step S21: forming a device layer 11 on the growth substrate 10.

The device layer 11 herein relates to a film layer used for forming the micro-components. The device layer 11 may be made of different materials according to the characteristics of the formed micro-components. Exemplarily, when the micro-components are micro-LEDs, the device layer 11 may include a first doped semiconductor layer, a quantum well layer and a second doped semiconductor layer formed on the growth substrate 10 in sequence. The first doped semiconductor layer is an n-doped semiconductor layer and the second doped semiconductor layer is a p-doped semiconductor layer, or the first doped semiconductor layer is a p-doped semiconductor layer and the second doped semiconductor layer is an n-doped semiconductor layer.

Step S22: patterning the device layer 11 so as to form a plurality of micro-component mesa structures 12, wherein two adjacent micro-component mesa structures 12 are connected by a non-removed part 13 of the device layer 11 therebetween. A photolithography technology can be used when patterning the device layer 11.

Correspondingly, the step S6 includes: patterning the micro-component mesa structures 12 to remove the non-removed parts 13 of the device layer 11 so as to form a plurality of micro-components.

Figure 11:
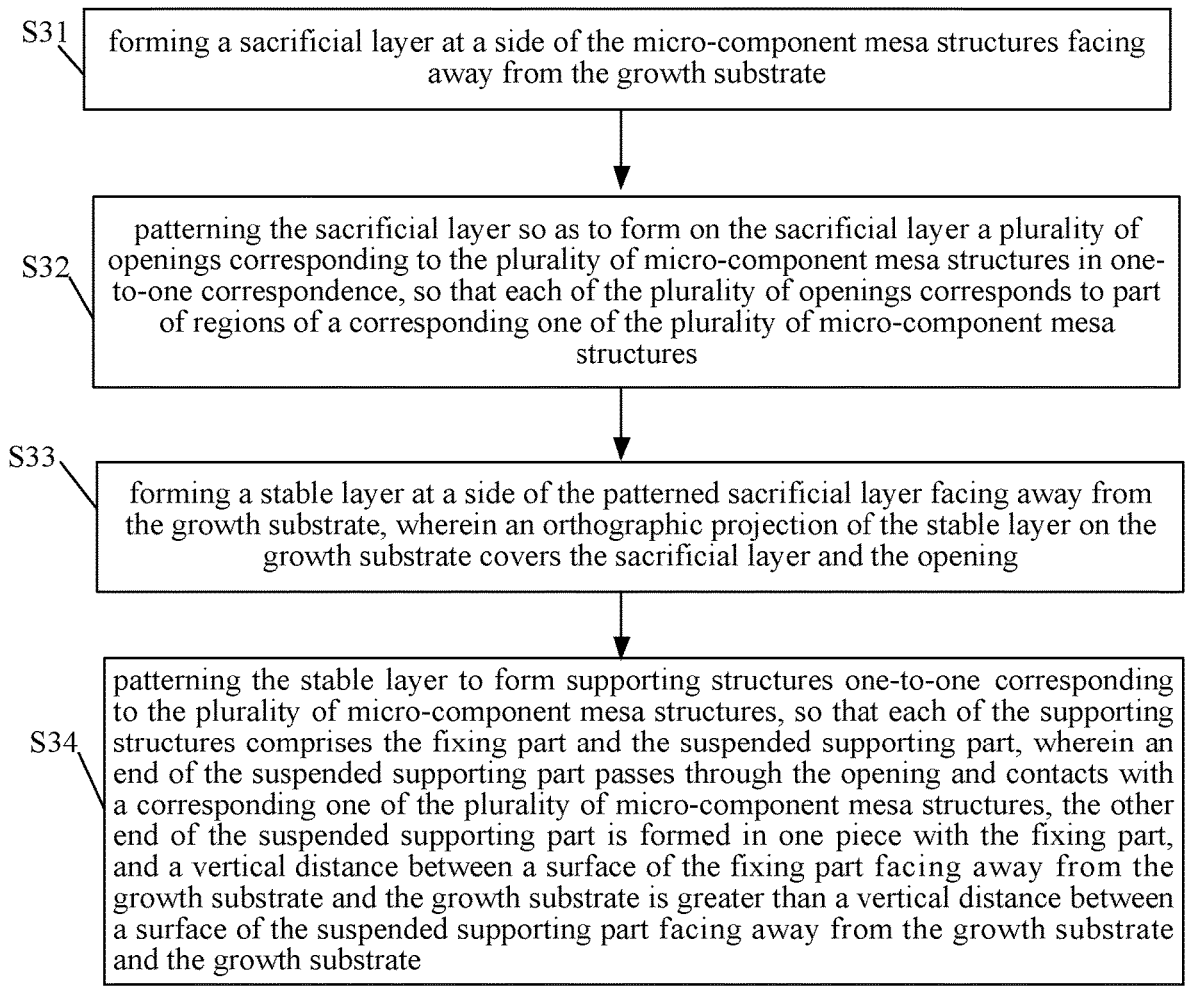
FIG. 11 is a schematic diagram of a method for producing the transfer printing substrate provided in a third embodiment of the present disclosure.
Figure 12:
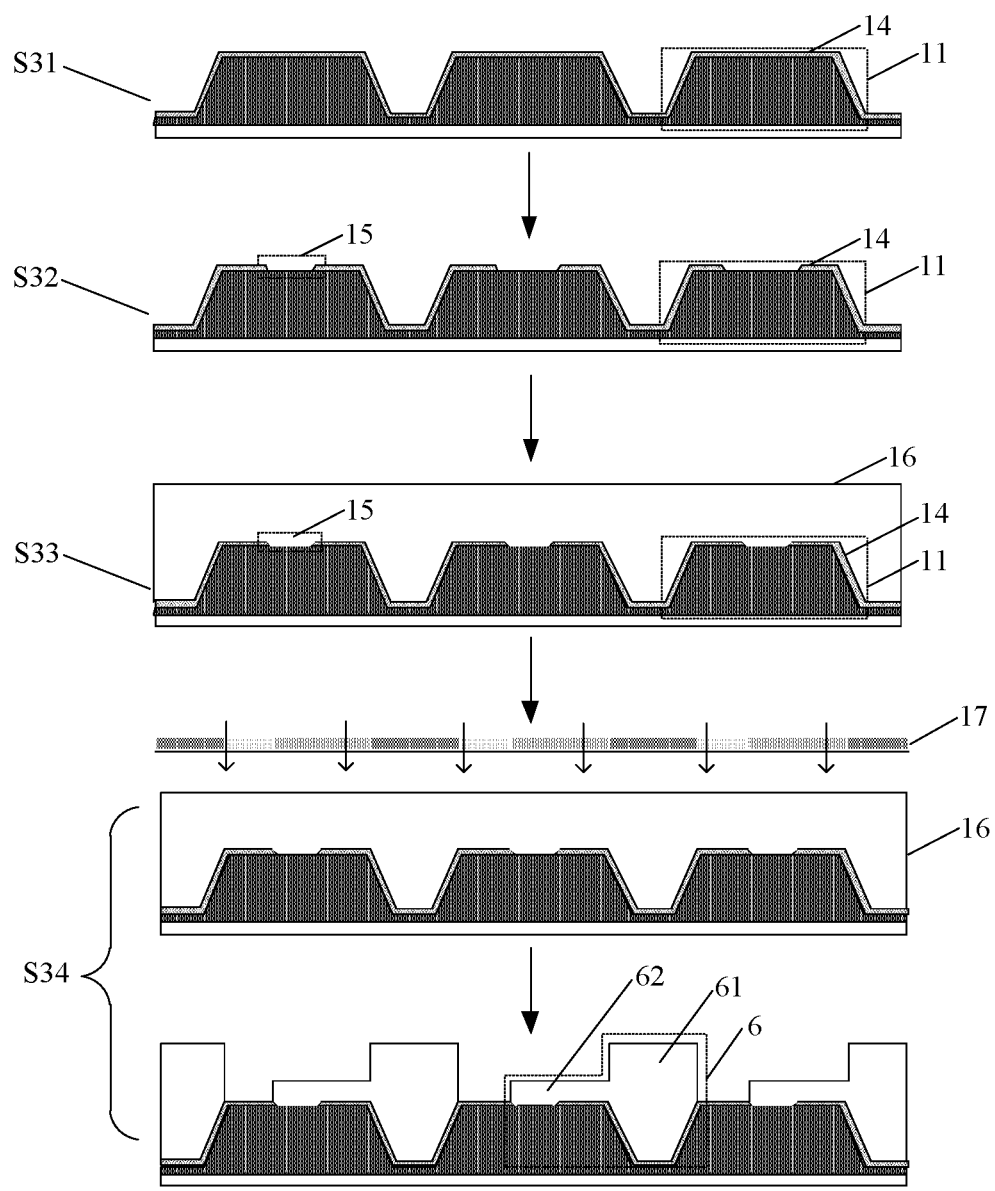
FIG. 12 is a process flow diagram of the method for producing the transfer printing substrate provided in the third embodiment of the present disclosure.

As shown in FIGS. 11 and 12, the step S3 includes:

Step S31: forming a sacrificial layer 14 at the side of the micro-component mesa structure 12 facing away from the growth substrate 10.

Optionally, the sacrificial layer 14 can be deposited by sputtering or low-temperature plasma enhanced chemical vapor deposition. Compared with a sacrificial layer 14 deposited by atomic layer deposition or high-temperature plasma enhanced chemical vapor deposition, the sacrificial layer 14 formed in this way are much easier to be removed than other film layers. The sacrificial layer 14 may be made of an oxide or nitride material.

Step S32: patterning the sacrificial layer 14 to form on the sacrificial layer 14 a plurality of openings 15 corresponding to the plurality of micro-component mesa structures 12 in one-to-one correspondence, so that each of the openings 15 corresponds to part of regions of the corresponding micro-component mesa structure 12.

Step S33: forming a stable layer 16 at the side of the patterned sacrificial layer 14 facing away from the growth substrate 10, wherein the orthographic projection of the stable layer on the growth substrate 10 covers the sacrificial layer 14 and the opening 15.

It can be understood that the stable layer 16 is a film layer used for forming a supporting structure. Then the stable layer 16 can be provided with a great thickness, such that, on one hand, the subsequently formed supporting structure 6 has better stability and the micro-components can be supported more stably; on the other hand, the suspended supporting part 62 of the supporting structure 6 and the carrying substrate 1 can be provided with a sufficient first moving space therebetween so as to ensure that the micro-components with small thicknesses can also be picked up and to improve the yield of picking up.

Step S34: patterning the stable layer to form supporting structures 6 corresponding to the plurality of micro-component mesa structures 12 in one-to-one correspondence, so that each of the supporting structures 6 includes a fixing part 61 and a suspended supporting part 62, wherein an end of the suspended supporting part 62 passes through the opening 15 and contacts with the corresponding micro-component mesa structure 12, the other end of the suspended supporting part 62 is formed with the fixing part 61 in one piece, and the vertical distance between the growth substrate 10 and the surface of the fixing part 61 facing away from the growth substrate 10 (the upper surface of the fixing part 61 shown in FIG. 12) is greater than the vertical distance between the growth substrate 10 and the surface of the suspended supporting part 62 facing away from the growth substrate 10 (the upper surface of the suspended supporting part 62 shown in FIG. 12).

In one embodiment, a photolithography technology, for example a halftone mask technology, can be used for patterning the stable layer. Referring to FIG. 12 again, the stable layer 16 can be exposed by using a halftone mask plate 17, and then the stable layer 16 is corroded so as to form a supporting structure 6.

The vertical distance between the growth substrate 10 and the surface of the fixing part 61 facing away from the growth substrate 10 is greater than the vertical distance between the growth substrate 10 and the surface of the suspended supporting part 62 facing away from the growth substrate 10. That is to say, after the carrying substrate 1 is subsequently placed on the fixing part 61, the suspended supporting part 62 and the carrying substrate 1 will have a particular first moving space therebetween, which leaves a motion space for the transfer printing heads 5 moving towards the carrying substrate 1 so as to ensure all of the micro-components with different thicknesses formed on the transfer printing substrate sufficiently contact with the corresponding transfer printing heads 5, so that all of the micro-components are picked up by the corresponding transfer printing heads 5. Furthermore, it can be seen based on the structure of the fixing part 61 that the vertical distance between the surface of the fixing part 61 facing towards the growth substrate (the lower surface of the fixing part 61 shown in FIG. 12) and the subsequently placed carrying substrate 1 is greater than the vertical distance between the surface of the micro-component facing away from the growth substrate (the upper surface of the micro-component mesa structure 12 shown in FIG. 12) and the subsequently placed carrying substrate 1. The location of the micro-components can thus be defined and the deviation of the micro-components can be reduced, so that the micro-components are picked up by the corresponding transfer printing heads 5 in a better way.

Correspondingly, the method for producing the transfer printing substrate further includes removing the sacrificial layer 14 after the step S6. After the sacrificial layer 14 is removed, a second moving space is provided between the fixing part 61 and the adjacent micro-component, which prevents the fixing part 61 from abrading the micro-component.

Furthermore, in order to produce a strong adhesive force between the formed stable layer 16 and the sacrificial layer 14, after the sacrificial layer 14 is formed in the step S31, a second adhesive layer may be formed on the surface of the sacrificial layer 14 facing away from the growth substrate 10. Correspondingly, patterning the sacrificial layer 14 in the step S32 includes: patterning the sacrificial layer 14 and the second adhesive layer to form on the sacrificial layer 14 and the second adhesive layer a plurality of openings 15 corresponding to the plurality of micro-component mesa structures 12 in one-to-one correspondence.

Figure 13:
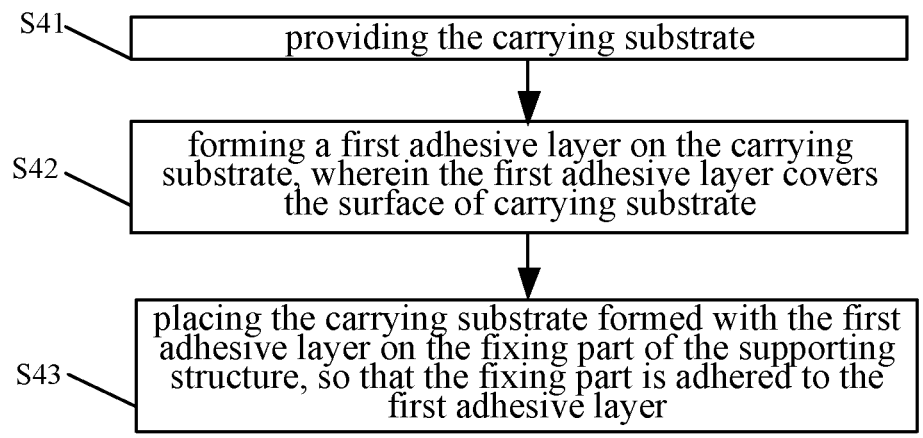
FIG. 13 is a schematic diagram of a method for producing the transfer printing substrate provided in a fourth embodiment of the present disclosure.
Figure 14:
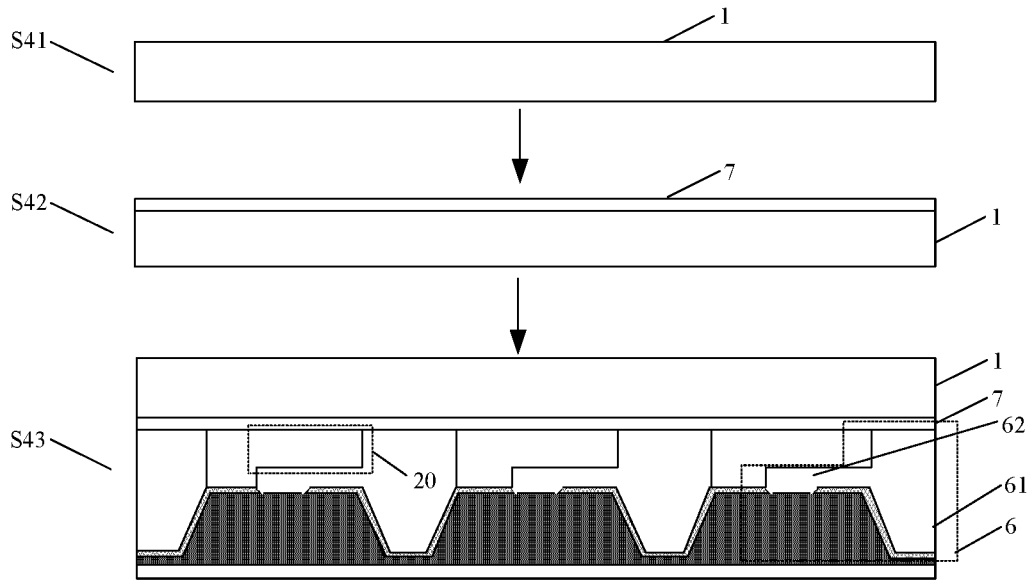
FIG. 14 is a process flow diagram of the method for producing the transfer printing substrate provided in the fourth embodiment of the present disclosure.

As shown in FIGS. 13 and 14, the step S4 includes:

Step S41: providing a carrying substrate 1.

Step S42: forming a first adhesive layer 7 on the carrying substrate 1, wherein the first adhesive layer 7 covers the surface of the carrying substrate 1.

Step S43: placing the carrying substrate 1 formed with a first adhesive layer 7 on the fixing part 61 of the supporting structure 6, wherein the fixing part 61 is adhered with the first adhesive layer 7, so that the fixing part 61 supports the carrying substrate 1, and a first moving space 20 is provided between the suspended supporting part 62 and the carrying substrate 1.

By means of arranging a first adhesive layer 7 on the carrying substrate 1, on one hand, the fixing part 61 can be adhered, achieving a more stable connection between the fixing parts 61 and the carrying substrate 1 and a better stability of the supporting structures 6. On the other hand, when the suspended supporting part 62 is broken due to a great deformation of the suspended supporting part 62, the broken suspended supporting part 62 can be adhered on the first adhesive layer 7, in which way the broken suspended supporting part 62 cannot be driven away from the carrying substrate 1 together with the corresponding micro-components by the transfer printing heads 5.

In one embodiment, when the micro-components are micro-LEDs, between the steps S2 and S3, the method for producing a transfer printing substrate further includes: forming a first conducting layer on the surface of each of the micro-component mesa structures facing away from the growth substrate, respectively. After the step S5, the method for producing the transfer printing substrate further includes: forming a second conducting layer on the surface of each of the micro-components facing away from the carrying substrate, respectively.

When the first conducting layer particularly includes a bonding layer, a diffusion blocking layer, a sticking-blocking layer, a reflector layer and an electrode layer, the process of forming the first conducting layer includes: forming an electrode layer on the surface of the micro-component facing away from the growth substrate, forming a reflector layer on the surface of the electrode layer facing away from the growth substrate, forming a sticking-blocking layer on the surface of the reflector layer facing away from the electrode layer, forming a diffusion blocking layer on the surface of the sticking-blocking layer facing away from the reflector layer, and forming a bonding layer on the surface of the diffusion blocking layer facing away from the sticking-blocking layer.

Figure 15:
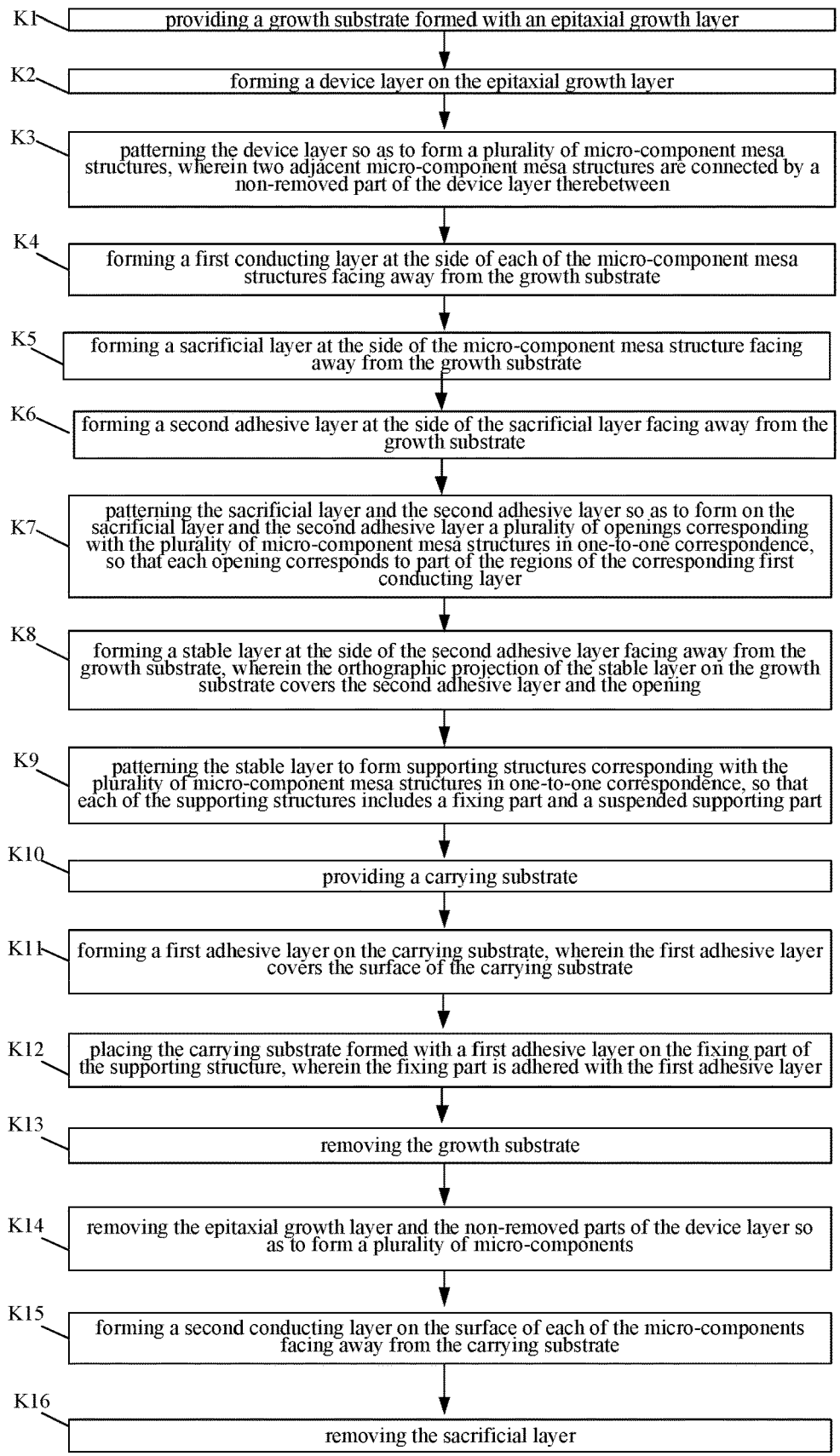
FIG. 15 is a schematic diagram of a method for producing the transfer printing substrate according to a fifth embodiment of the present disclosure.
Figure 16:
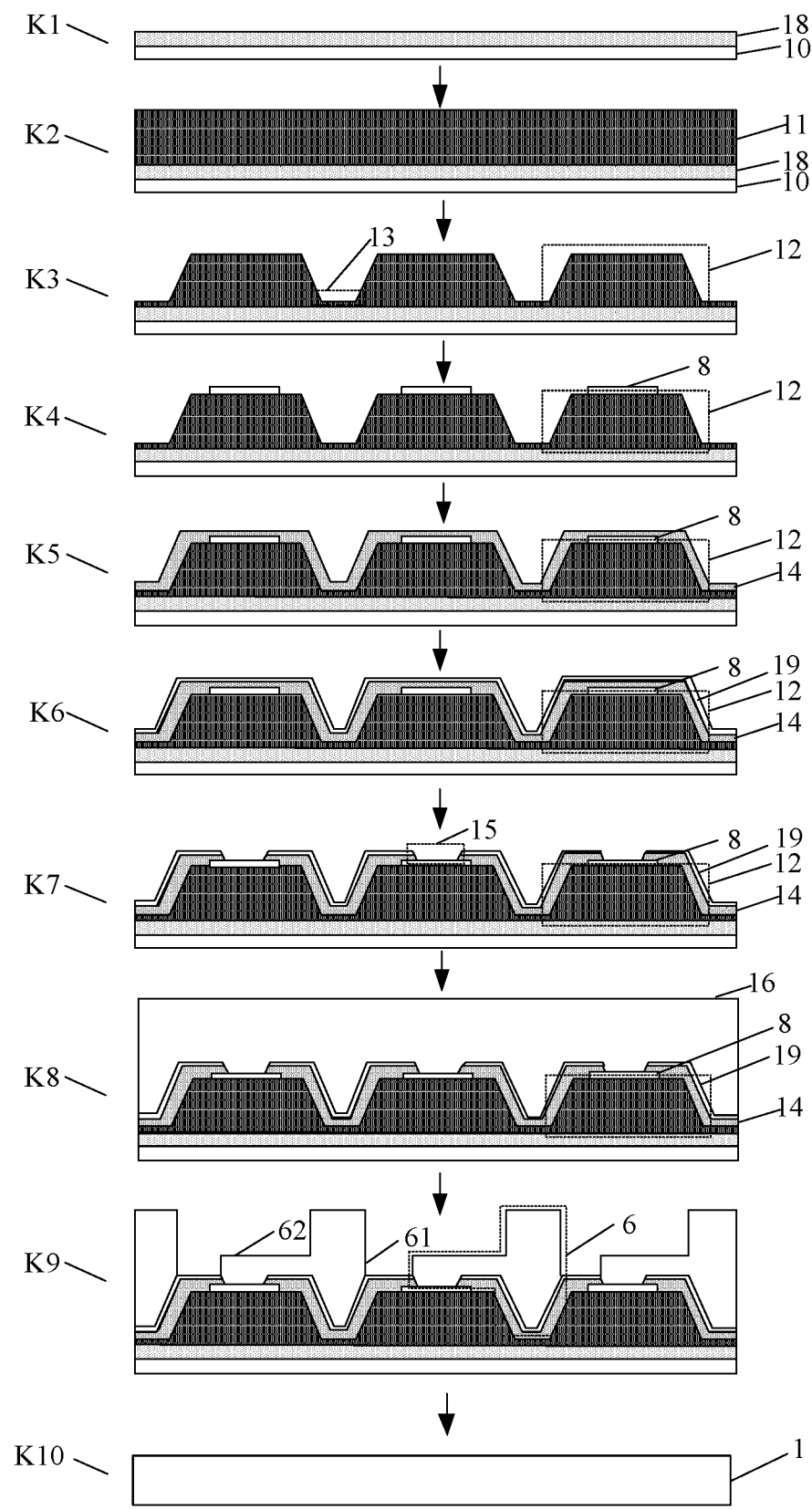
FIG. 16 is a process flow diagram of the method for producing the transfer printing substrate provided in the fifth embodiment of the present disclosure.
Figure 17:
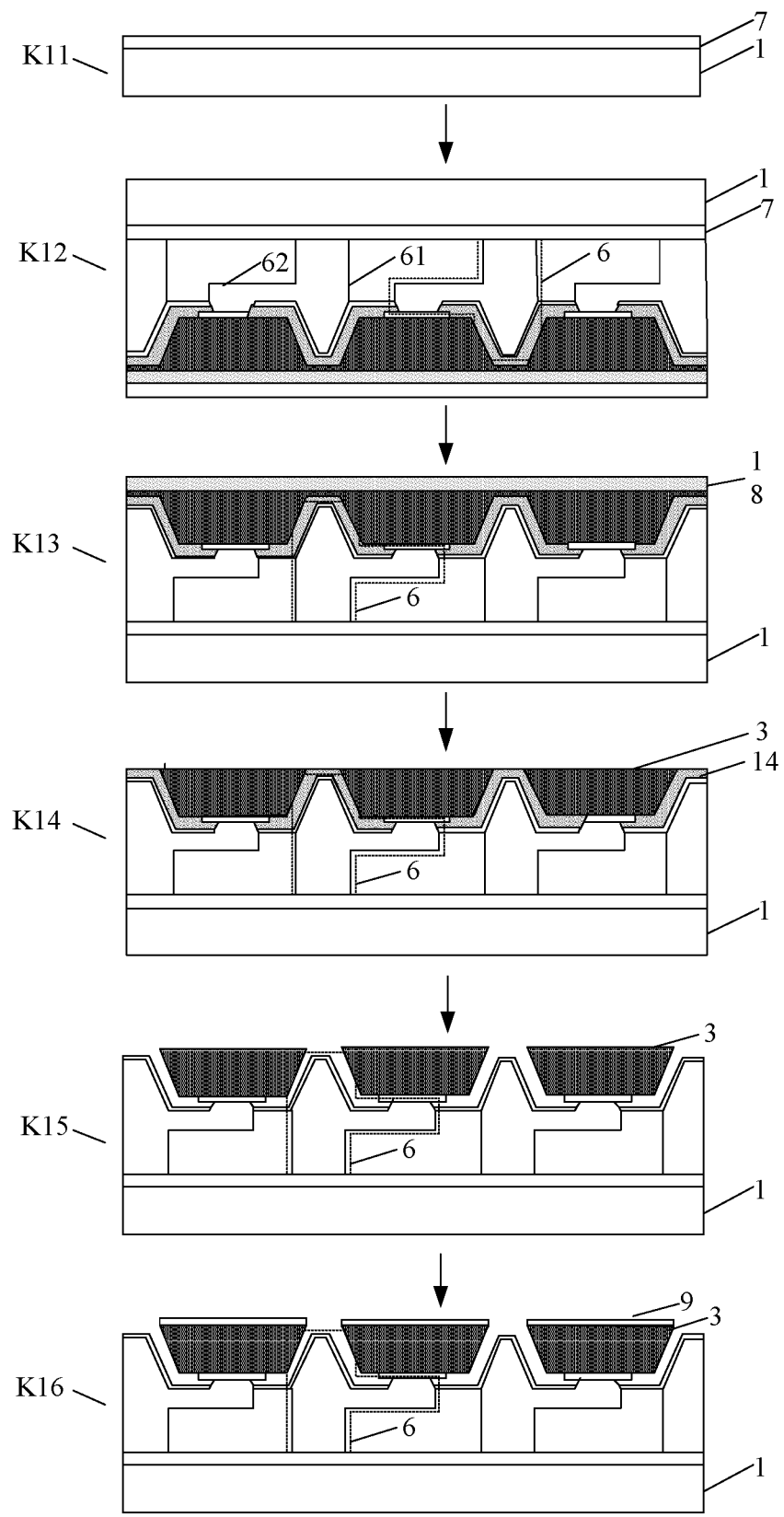
FIG. 17 is a process flow diagram of the method for producing the transfer printing substrate provided in the fifth embodiment of the present disclosure.

Taking the micro-components being micro-LEDs as an example, with reference to FIGS. 15-17, the technological processes of the method for producing a transfer printing substrate are fully described in the followings:

Step K1: providing a growth substrate 10 formed with an epitaxial growth layer 18.

Step K2: forming a device layer 11 on the epitaxial growth layer 18.

Step K3: patterning the device layer 11 so as to form a plurality of micro-component mesa structures 12, wherein two adjacent micro-component mesa structures 12 are connected by a non-removed part 13 of the device layer 11 therebetween.

Step K4: forming a first conducting layer 8 at the side of each of the micro-component mesa structures 12 facing away from the growth substrate 10.

Step K5: forming a sacrificial layer 14 at the side of the micro-component mesa structure 12 facing away from the growth substrate 10.

Step K6: forming a second adhesive layer 19 at the side of the sacrificial layer 14 facing away from the growth substrate 10.

Step K7: patterning the sacrificial layer 14 and the second adhesive layer 19 so as to form on the sacrificial layer 14 and the second adhesive layer 19 a plurality of openings 15 corresponding with the plurality of micro-component mesa structures 12 in one-to-one correspondence, so that each opening 15 corresponds to part of the regions of the corresponding first conducting layer 8.

Step K8: forming a stable layer 16 at the side of the second adhesive layer 19 facing away from the growth substrate 10, wherein the orthographic projection of the stable layer on the growth substrate 10 covers the second adhesive layer 19 and the opening 15.

Step K9: patterning the stable layer to form supporting structures 6 corresponding with the plurality of micro-component mesa structures 12 in one-to-one correspondence, so that each of the supporting structures 6 includes a fixing part 61 and a suspended supporting part 62.

Step K10: providing a carrying substrate 1.

Step K11: forming a first adhesive layer 7 on the carrying substrate 1, wherein the first adhesive layer 7 covers the surface of the carrying substrate 1.

Step K12: placing the carrying substrate 1 formed with a first adhesive layer 7 on the fixing part 61 of the supporting structure 6, wherein the fixing part 61 is adhered with the first adhesive layer 7.

Step K13: removing the growth substrate 10.

Step K14: removing the epitaxial growth layer 18 and the non-removed parts 13 of the device layer 11 so as to form a plurality of micro-components 3.

Step K15: forming a second conducting layer 9 on the surface of each of the micro-components 3 facing away from the carrying substrate 1.

Step K16: removing the sacrificial layer 14.

With respect to a transfer printing substrate formed by using said method, a first moving space is provided between the suspended supporting part of the supporting structure and the carrying substrate. When part of the transfer printing heads contact with the micro-components with greater thicknesses first, the transfer printing heads can continue moving towards the carrying substrate, which ensures sufficient contact of the micro-components having different thicknesses with the corresponding transfer printing heads, so that all of the micro-components are picked up by the corresponding transfer printing heads, thus the yield of picking up is improved, and the problem of uneven image brightness caused by missing of part of the micro-components on the display substrate is avoided.

Taking the micro-components being micro-LEDs as an example, the micro-components formed on the transfer printing substrate may particularly be R, G, B tri-color micro-LEDs. During the process of transferring, the R, G, B tri-color micro-LEDs may be correspondingly picked up in batches by a plurality of transfer printing heads and the LED particles picked up in batches are transferred to corresponding regions of the display substrate respectively. For example: firstly, a plurality of red LED particles are picked up and transferred to corresponding regions of the display substrate. Then, a plurality of green LED particles are picked up and transferred to corresponding regions of the display substrate. Finally, a plurality of blue LED particles are picked up and transferred to corresponding regions of the display substrate. After forming a complete display panel by subsequent production, according to actual requirements, the micro-LEDs transferred to the display substrate may be driven to emit light of different colors during displaying images, so that a full-color LED display of the display panel is realized.

It should be pointed out that the micro-components generally relate to tiny components with sizes from 1 µm to 100 µm. However, the sizes of the formed micro-components in the embodiments of the present disclosure are not limited thereto. Furthermore, the micro-components involved in the embodiments of the present disclosure are not limited to the micro-LEDs only, but can also be silicon chips provided with logical units and storages, or gallium arsenide circuits used for radio frequency communication, or, certainly, other structures. Correspondingly, the substrate used for receiving the micro-components in the embodiments of the present disclosure is not limited to the display substrate. According to the particular type of the transferred micro-components, the substrate used for receiving the micro-components may be a lighting base substrate, or a base substrate having functional devices such as transistors or integrated circuits, or a base substrate having metal distribution lines.

The above descriptions are only preferred embodiments of the present disclosure and are not used to limit the present disclosure. Any modification, equivalent substitution, improvements and the like made within the spirit and principles of the present disclosure should be included in the scope protected by the present disclosure.

What is claimed is:

1. A transfer printing substrate, comprising:
   a carrying substrate;
   a first adhesive layer provided on the carrying substrate;
   a plurality of supporting structures; and
   a plurality of micro-components corresponding to the plurality of support structures in one-to-one correspondence;
   wherein each of the plurality of supporting structures comprises a fixing part and a suspended supporting part, wherein an end of the fixing part is fixed on the carrying substrate, an end of the suspended supporting part is connected to the fixing part, and another end of the suspended supporting part supports the corresponding one of the plurality of micro-components,
   wherein a first moving space is provided between the suspended supporting part and the carrying substrate, and
   wherein the fixing part of the supporting structure is adhered to the first adhesive layer, and the first adhesive layer is further configured to adhere a broken suspended supporting part.

2. The transfer printing substrate according to claim 1, wherein the fixing part of each of the plurality of supporting structures is located between the corresponding micro-component and another micro-component adjacent to the corresponding micro-component, and a vertical distance between the carrying substrate and a surface of the fixing part facing away from the carrying substrate is greater than a vertical distance between the carrying substrate and a surface of the corresponding micro-component facing towards the carrying substrate.

3. The transfer printing substrate according to claim 2, wherein a second moving space is provided between the fixing part and one of the micro-components adjacent to the fixing part.

4. The transfer printing substrate according to claim 1, wherein, for each of the supporting structures, the fixing part and the suspended supporting part are formed in one piece.

5. The transfer printing substrate according to claim 1, wherein each of the plurality of micro-components is a micro light emitting diode (micro-LED), and the transfer printing substrate further comprises a first conducting layer provided between the micro-LED and the corresponding suspended supporting part and a second conducting layer provided on a surface of the micro-LED facing away from the carrying substrate.

6. The transfer printing substrate according to claim 5, wherein the first conducting layer comprises a bonding layer, a diffusion blocking layer, a sticking-blocking layer, a reflector layer and an electrode layer located on the suspended supporting part in sequence.

7. The transfer printing substrate according to claim 1, wherein the plurality of micro-components is arranged in matrix.

8. A transfer printing substrate, comprising a carrying substrate, a plurality of supporting structures, and a plurality of micro-components corresponding to the plurality of support structures in one-to-one correspondence,
   wherein each of the plurality of supporting structures comprises a fixing part and a suspended supporting part, wherein an end of the fixing part is fixed on the carrying substrate, an end of the suspended supporting part is connected to the fixing part, and another end of the suspended supporting part supports the corresponding one of the plurality of micro-components, and
   wherein a first moving space is provided between the suspended supporting part and the carrying substrate, and
   wherein each of the plurality of micro-components is a micro light emitting diode (micro-LED), and the transfer printing substrate further comprises a first conducting layer provided between the micro-LED and the corresponding suspended supporting part and a second conducting layer provided on a surface of the micro-LED facing away from the carrying substrate.

9. The transfer printing substrate according to claim 8, wherein the first conducting layer comprises a bonding layer, a diffusion blocking layer, a sticking-blocking layer, a reflector layer and an electrode layer located on the suspended supporting part in sequence.

* * * * *